US006236144B1

(12) United States Patent
Millar et al.

(10) Patent No.: US 6,236,144 B1
(45) Date of Patent: *May 22, 2001

(54) ACOUSTIC IMAGING ARRAYS

(75) Inventors: Caroline E. Millar; Kevin J. Lodge; Anthony P. Needham, all of Northamptonshire (GB)

(73) Assignee: GEC-Marconi Limited (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,870

(22) Filed: Aug. 24, 1998

Related U.S. Application Data

(63) Continuation-in-part of application No. 08/759,370, filed on Dec. 4, 1996, now abandoned.

(30) Foreign Application Priority Data

Dec. 13, 1995 (GB) .................................................. 9525418

(51) Int. Cl.$^7$ ...................................................... H01L 41/08

(52) U.S. Cl. ............................................ 310/334; 310/316

(58) Field of Search .................................... 310/334–337, 310/316, 317, 319, 366, 348, 357–359

(56) References Cited

U.S. PATENT DOCUMENTS 5,316,000 * 5/1994 Chapelon et al. ............... 310/334 X
5,410,205 * 4/1995 Gururaja .......................... 310/334 X
5,810,009 * 9/1998 Mine et al. ...................... 310/334 X
5,825,117 * 10/1998 Ossmann et al. ................ 310/334 X

FOREIGN PATENT DOCUMENTS 37 33 776 4/1988 (DE) .
0 559 963 9/1993 (EP) .
1 530 783 11/1978 (GB) .

OTHER PUBLICATIONS

Hall, D.D.N., et al., "Theoretical And Experimental Evaluation of a Two–Dimensional Composite Matrix Arrayl", IEEE Transactions on Ultrasonics, Ferroelectrics and Frequency Control., vol. 40, No. 6, Nov. 1, 1993, pp. 704–709.

* cited by examiner

*Primary Examiner*—Mark Budd
(74) *Attorney, Agent, or Firm*—Kirschstein, et al.

(57) ABSTRACT

An acoustic imaging system comprises a plurality of piezoelectric elements in a piezoelectic array. The array comprises a plurality of physically separate sub-arrays which are assembled together. It is supported on an interconnect layer. The elements are connected to the interconnect layer by a plurality of electrically conductive paths. The elements receive acoustic energy and convert it into electrical signals. The signals are transmitted along the plurality of electrically conductive paths and through the interconnect layer to an image processor which processes the signals to produce an image.

8 Claims, 2 Drawing Sheets

ACOUSTIC IMAGING ARRAYS

CROSS REFERENCE TO RELATED APPLICATIONS

This application is a continuation-in-part of U.S. patent application Ser. No. 08/759,370, filed Dec. 4, 1996, now abandoned.

BACKGROUND OF THE INVENTION

This invention relates to acoustic imaging arrays.

It is well known to use a row of acoustic elements in an acoustic imaging system. These are in the form of a one-dimensional (1D) array such as a series of individual elements spaced along a single row or column. Conventionally the acoustic elements are formed from a piezoelectric material. The elements generate an acoustic signal which propagates through a medium and is reflected by an object in the medium which is to be detected. Signals reflected by the object are detected by the elements and electrical signals are generated which can then be processed. An acoustic imaging system using a 1D array is used in ultrasound imaging to provide internal images of the human body or to image underwater objects. A two-dimensional (2D) image is generated by physically sweeping the 1D array over the region to be imaged.

It has been proposed to use 2D arrays to generate 2D and 3D images. A 2D array may be a plurality of individual elements arranged in a grid. Compared with a 1D array, a 2D array provides improved resolution and better quality image and also eliminates the need for physical focussing or sweeping allowing real time images to be obtained. However, the use of 2D arrays has been limited by the difficulty in processing large amounts of data which would be generated by an array of any useful size, for example 10,000 elements in an array of 100×100. Furthermore, it is difficult to make connections to such a large number of elements on a scale of several centrimeters squared.

Although the difficulties in data processing can now be tacked by using high power computers having faster processing speeds it does not deal with the problem of the large number of connections. The connections and associated connecting tracks are supported by an interconnect layer. However, the interconnect layer often has an acoustic impedance which differs to that of the elements and acoustic reflections are caused by the mismatch. Although reflections can be minimized using materials having a better match of acoustic impedance, problems are encountered as the number of elements in an array is increased. As the number of elements in the array increases the thickness of the interconnect layer must also be increased which increases the amount of acoustic reflections. This degrades the sensitivity of the system.

Another problem is cross coupling between elements in the array. This becomes more severe as the scale of the array is reduced and the elements are closer together.

SUMMARY OF THE INVENTION

According to a first aspect the invention provides an acoustic imaging system comprising an array of elements for receiving acoustic energy and converting the energy into electrical signals; a track layer having a plurality of electrically conductive tasks; processing means for receiving and processing the electrical signals and a plurality of electrically conductive paths electrically connecting the elements to the processing means wherein the array comprises a plurality of physically separate sub-arrays which are assembled together.

With such a modular arrangement of sub-arrays, little or no redesign of the track layer is required to produce larger arrays.

Preferably the elements also generate acoustic energy. Preferably the acoustic energy is in the range 0.1 to 20 MHz.

Preferably the elements comprise piezoelectric material. Most preferably the piezoelectric material is ceramic. It may be lead zirconate titanate (PZT). The array may comprise a 1–3 composite of elongate members of piezoelectric material embedded in a matrix. Preferably the matrix is a polymer material, for example epoxy resin.

An advantage of using a filled matrix is that an element may comprise a plurality of elongate members. Therefore, the size (and particularly the width) of the elongate members can be much smaller than the usual size of an element. If the elongate members are reduced to a size much smaller than the wavelength of acoustic waves generated and/or detected by the system, acoustic coupling between the members is reduced. Embedding the elongate members in a matrix means that they can be smaller, that is more fragile, because they are supported. In addition the matrix filler reduces cross-coupling and also reduces acoustic impedance of the array of elements. This avoids the need to use additional techniques to reduce cross-coupling, for example supporting individual elements on a diced backing layer.

Preferably a plurality of elongate members are in electrical contact with each electrically conducting path. The size and shape of the cross section of an electrically conducting path can be chosen to define a particular group of elongate members as an individual element. The elements may be all identical or may differ, for example for different purposes. In one embodiment one element comprises nine elongate members in a mini-array or matrix of 3×3.

In one embodiment a sub-array comprises 100 elements. Preferably outputs from elements of a sub-array are fanned down onto a readout chip. Outputs from a plurality of readout chips, each connected to a sub-array, may be multiplexed together to provide an overall array output.

The sub-arrays may be designed to transmit and/or receive at different operating frequencies so that in total the array may have multi-frequency characteristics. The operating frequency of each sub-array is determined by its thickness. Preferably a plurality of sub-arrays have a plurality of different thickness to produce a plurality of different operating frequencies.

Preferably an absorbing layer for absorbing acoustic energy is present in the acoustic imaging system. It may be disposed between the array and the track layer. Preferably it comprises the plurality of electrically conductive paths, for example a polymer having conducting paths in a matrix. The matrix and/or the paths may be loaded to provide suitable properties, for example conductivity and absorption of acoustic energy.

Preferably a common electrode is in electrical contact with a front face of the array. Preferably groups of elongate members are connected to a respective contact pad at a rear face of the array. The contact pads may have shapes to define the shapes of the elements.

Preferably the common electrode supports a quarter wave matching layer which is matched acoustically minimized reflections of acoustic waves. The acoustic impedance of the matching layer preferably will be between that of the medium, for example water, and that of the piezoelectric material.

The array may be shaped to provide quasi-optical effects, for example focussing.

The array may be a linear 1D array or a 2D array. A 2D is an arrangement having m rows and n columns where n and m are both greater than unity.

BRIEF DESCRIPTION OF THE DRAWINGS

An embodiment of the invention will now be described, by way of example only, with reference to the accompanying drawings, in which.

DETAILED DESCRIPTION OF THE PREFERRED EMBODIMENTS

Figure 1:
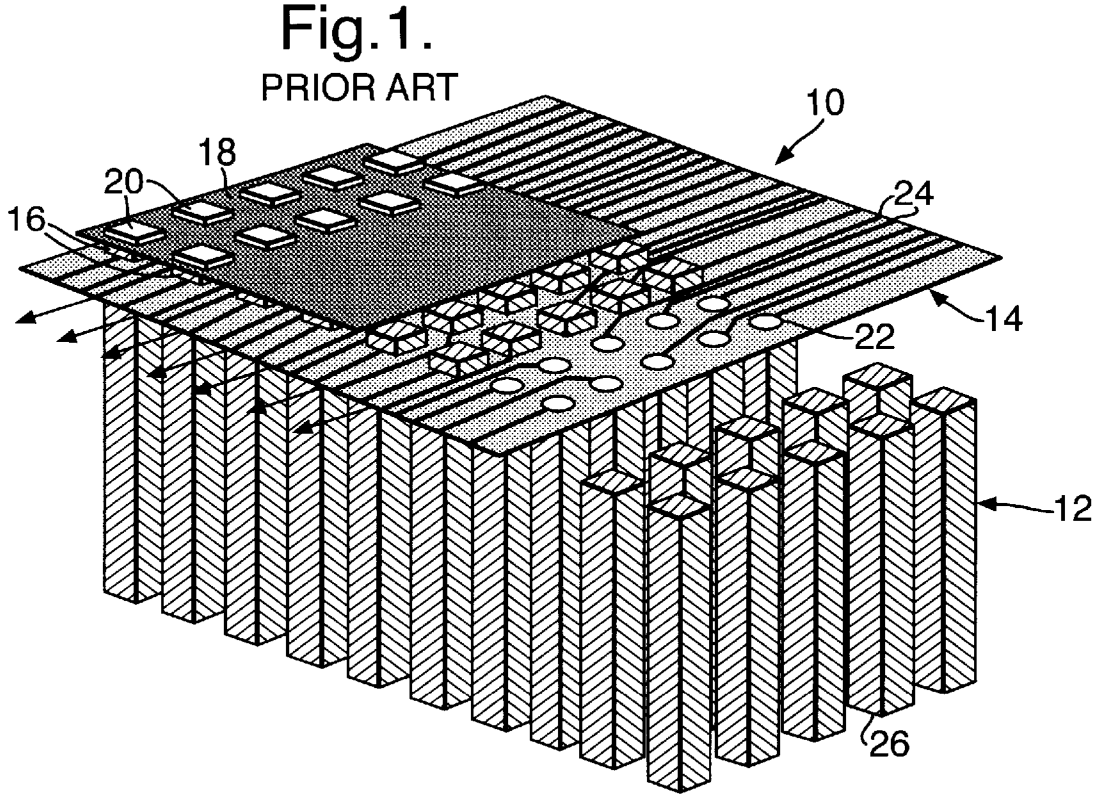
Fig.1. PRIOR ART
FIG. 1 shows a perspective view of a known array according to the prior art.

FIG. 1 shows a known 2D acoustic imaging array 10 comprising a backing layer 12, an interconnect layer 14, an array of acoustic elements 16, a common electrode 18 and matching elements 20 located in positions which correspond to the acoustic elements 16.

The acoustic elements 16 comprise a piezoelectric ceramic material such as lead zirconate titanate. They are formed by dicing of a bulk piece of piezoelectric material. Electrical connections are formed on upper and lower faces of the elements to, respectively, the common electrode 18 and contact pads 22 on the interconnect layer 14.

The interconnect layer 14 contains a number of metal tracks 24 each of which terminates in one of the contact pads 22. Although in FIG. 1 the tracks are shown, conventionally they are contained within the body of the interconnect layer 14. This may be formed by any convenient route such as sintering and firing ceramic tape. Alternatively, it may comprise layers of a polyimide material.

The backing layer 12 is a sound absorbent material and may be an epoxy resin. The purpose of the backing layer 12 is to absorb any sound waves which travel through the interconnect layer 14 to prevent sound being reflected back to the elements from underneath. It comprises an array of rods 26 which are formed by dicing of a bulk piece of epoxy resin. The rods 26 all stand on, and are integrally part of, a base or substrate (not shown).

The backing layer 12 is formed as a rod-like structure in order to isolate acoustically elements 16 from each other to prevent cross coupling and thus degrade sensitivity. As can be seen in FIG. 1 the backing layer 12 has a large number of air gaps. Furthermore it is constructed such that one matching element 20, one element 16, one contact pad 22 and one rod 26 are all in register in a single stack. This configuration of providing separate stacks for each acoustic element 16 is necessary in order to avoid cross-coupling between adjacent elements 16. Providing isolated rods 26 overcomes the problem of cross coupling to some extent, but further problems are created by the rod-like structure having air gaps. If the array 10 is to be used underwater, water pressure can damage the rod-like structure.

Figure 2:
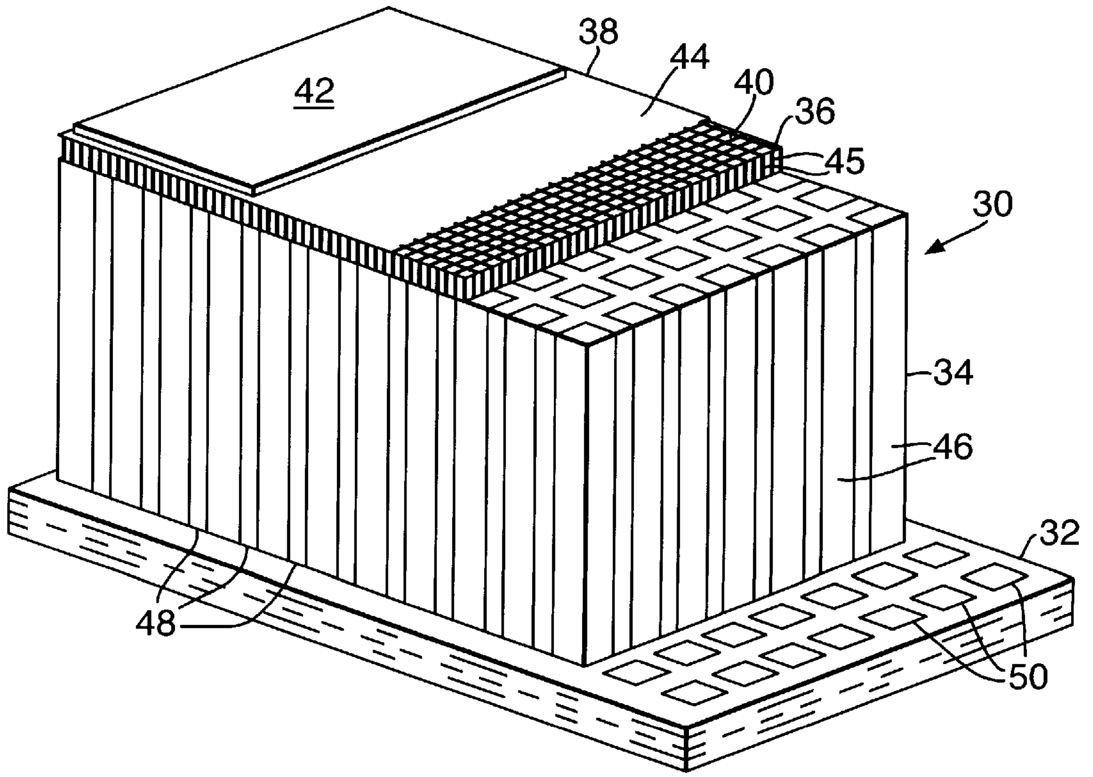
FIG. 2 shows a perspective view of an array according to the invention.

A 2D acoustic imaging array 30 according to the invention is shown in FIG. 2. It comprises an interconnect layer 32 carrying a backing layer 34 on which is located a piezoelectric layer 36. A common electrode 38 is present on an upper face 40 of the piezoelectric layer 36. A matching layer 42 is present on an upper face 44 of the common electrode 38.

The piezoelectric layer 36 in the form of a 1–3 composite. This is formed by dicing a sheet of piezoelectric material into elongate members 45 and then backfilling with a filler which forms a matrix supporting the piezoelectric elongate members. As a result the elongate members 45 are in a regular arrangement of rows and columns. The piezoelectric material is a ceramic such as lead zirconate titanate (PZT). The matrix is a polymer such as epoxy resin. It provides rigidity to the piezoelectric material for ease of handling during manufacture and ruggedness in use. In comparison with the known array 10 the array 30 is more pressure resistant which is useful in underwater applications where pressure is to be resisted. Furthermore, it reduces cross-coupling between adjacent acoustic elements in the piezoelectric layer 34 and reduces the overall acoustic impedance of the layer. As a result, the matching layer 42 can be an integral layer rather than a plurality of matching elements.

The backing layer 34 has also been formed by dicing of a bulk material and backfilling. In this case it results in an epoxy resin structure having tungsten loaded conductive paths 46 in a matrix of non-loaded insulator 48.

The piezoelectric layer 36 is in contact with the backing layer 34. It is important that this contact establishes good electrical contact between the elongate members 45 and the conductive paths 46 and so contact elements (not shown) are located on the back of the piezoelectric layer 36. Since this layer is in bulk rather than as discrete elements in the known array 10, it means that contact elements of any desired shape can be printed on the back of the layer to connect to (and activate) any desired shape or grouping of elongate members 45 to define individual elements. A convenience arrangement is for an individual element to be defined by a mini-array of 3:3 elongate members. Of course, each elongate member may be provided with its own conductive path. Alternatively there may be a variety of groupings of elongate members with different numbers of elongate members in each grouping, perhaps to perform different functions.

As mentioned in the foregoing, at one end the conductive paths 46 are electrically connected to the piezoelectric layer 36. If the contact elements were the same size and shape as the ends of the conductive paths 46, the ends as seen in FIG. 2 would define the elongate members 45 which comprise an individual element. At another end the conductive paths 46 are electrically connected to contact pads 50 on the interconnect layer. By separating the interconnect layer from the piezoelectric layer 36 by the backing layer, the thickness of the interconnect layer is much less important because little, if any, sound energy will reach it and so reflections will be less significant. In any case, reflections of sound energy will have to travel back through the backing layer 34 in order to be detected. Furthermore, electronics for controlling operation of the acoustic elements may be integrated directly on to the interconnect layer (either in it or underneath it) rather than being located remote from the array as in the known array 10. This gives improved performance as well as weight reduction since the track lengths between the piezoelectric layer and the electronics are minimized.

Figure 3:
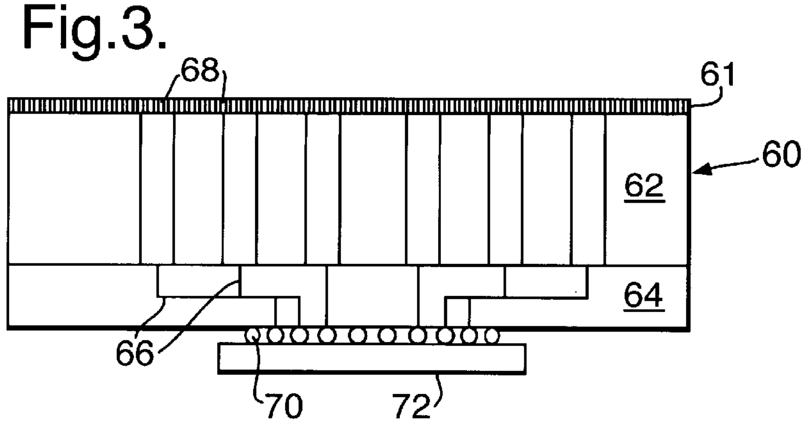
FIG. 3 shows a cross-sectional elevational view through a sub-array.

Although it is not shown in FIG. 2, the acoustic imaging array 30 is made up from a number of modules. FIG. 3 shows such a module 60 having a piezoelectric layer 61 comprising a sub-array of elements carried by a backing layer 62 which is supported on an interconnect layer 64. As mentioned above, the piezoelectric layer may be provided with a matching layer. Tracks 66 running through the interconnect layer connect conductive paths 68 in the backing layer to contacts 70 on a transmit/readout chip 72. In order to produce a complete imaging array, a plurality of separate modules are assembled together. The modules are fixed relative to one another either by joining individual modules to their neighbors or placing them on a common support or both.

Although FIG. 3 shows a module comprising a readout chip, in a preferred embodiment each module comprises only a piezoelectric layer, a backing layer and an interconnect layer. These are assembled together by placing them on, and connecting them to, a further interconnect layer to which readout chips are connected, typically one for each module. In another embodiment each module comprises only a piezoelectric layer and a backing layer. In this embodiment, a single interconnect layer, or interconnect structure, is required. The modules are assembled together by placing them on and connecting them to the single interconnect layer to which readout chips are connected, typically one for each module, that is each sub-array. The single interconnect layer performs both the function of providing electrical connection between elements of each sub-array to its respective readout chip and to multiplex outputs from the various readout chips. In a further embodiment the modules only comprise the piezoelectric layer (usually carrying a suitable matching later). In any of the foregoing embodiments which include modules the backing layer could be omitted altogether. Such an arrangement would be especially desirable if modules only comprising a piezoelectric layer were used. In this event to minimize reflection of acoustic signals from any interconnected layer behind the piezoelectric layer, it is desirable to reduce the size of contents between the elements and the interconnect layer. If this is done, the piezoelectric layer becomes substantially backed with a layer of fluid, such as air or vacuum which reduces the reflection. A contact size of less than 50 μm and preferably 20 to 40 μm provides such a reduction.

The readout chip 72 carries contacts for input of power and control and output of data. It may be mounted by a flip-chip solder bonding technique onto the back of the imaging array. Outputs from the sub-arrays of elements are connected to their respective readout chips 72 by fanning down the outputs onto the chips 72. Each chip 72 may have 10×10 contacts for a sub-array of 10×10 elements and may be a few millimeters square compared with several centimeters square for a 100×100 array. Signals from the sub-arrays (each of which represents a small part of an image detected by the entire array) are multiplexed together in a separate multiplexer chip to group together outputs of the elements in the entire array, for example 10,000, into a more manageable 100 outputs from 100 chips.

Figure 4:
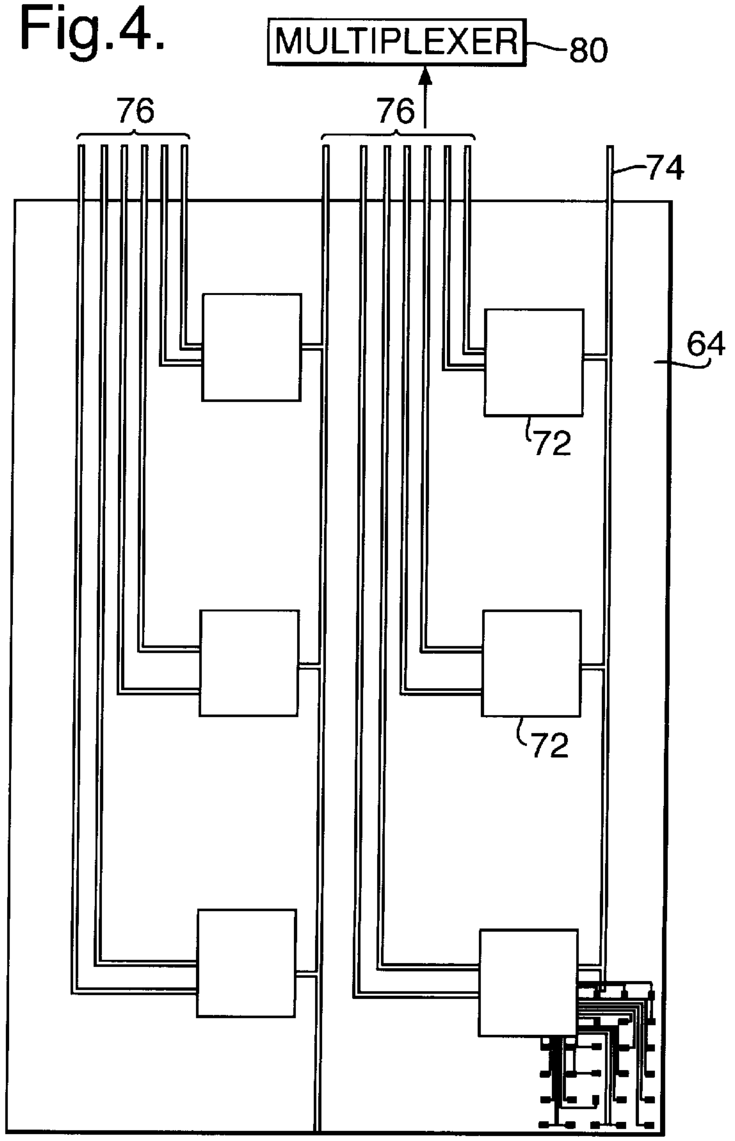
FIG. 4 shows a view from underneath an interconnect layer.

Referring now to FIG. 4, this arrangement shows the readout chips 72 bonded to the back of an interconnect layer 64 which is common to all of the modules. This may be either a single interconnect layer connected to all of the elements or a second interconnect layer connected to all of the interconnect layers of each module. Such an interconnect layer connects to a main multiplexer 80 which multiplexes together the outputs from all of the chips 72. The main multiplexer is bonded or connected to the interconnect layer 64. Power is supplied to the chips along line 74 and timing and data outputs are taken from lines 76. Data is supplied by lines 76 to a data processor which can generate images.

A typical array used in an underwater imaging application has individual elongate members having end face dimensions of 300×300 μm. The elongate members are separated by gaps of 100 μm and so are arranged at a pitch of 400 μm. The elongate members are grouped into mini-arrays of 3×3, that is 9 in all, to make up each element. A single sub-array comprises 32×32 such elements, that is 9216 elongate members. Each element is connected to a readout chip provided for that sub-array. In order to have reasonable imaging four such sub-arrays need to be grouped together, that is to provide an overall array of 64×64 elements. Alternatively, for a medical imaging application where the sensitivity of each element is not so important, each element may comprise a single elongate member. In this case each sub-array would comprise 32×32 elongate members.

The dimensions of the elongate members depend on the operating frequency and required resolution. Operation in the frequency range 0.1 to 20 MHz is envisaged. One particular embodiment operates at about 3 MHz. The thickness of the backing layer, if present, is about 10 mm. The invention would be suitable for fabricating an array of 100×100 although larger arrays may readily be fabricated using a modular arrangement having separate sub-arrays.

The imaging system can be used to steer a transmitted beam of acoustic energy. This may be achieved by transmitting a sonic beam which is steered by phasing the array during transmission. The transmitted beam would be pulsed. An image may then be formed from signals received by the array.

To assist in imaging the system may comprise external acoustic imaging lenses. Alternatively, the array, backing material and/or interconnect layer may be shaped to provide self-focussing.

Although complete arrays have been described, a sparse array could be used instead in which processing means interpolates readings between sparsely scattered detecting elements.

Using a modular arrangement or construction provides an easier way to produce an array having a multi-frequency operation. Sub-arrays having elongate members of differing lengths will resonate at different frequencies. Therefore, deliberately varying the lengths of elongate members provides multi-frequency operation.

The invention is particularly suitable for imaging in liquid. It could have civil or other applications and could be used for imaging in unclear water such as in a diver's helmet in conjunction with a head-up display or in a submersible vehicle for guidance or imaging systems. Alternatively, it could be used in a medical imaging system or for non-destructive testing of structures such as solids. Essentially the system may be used in any application to detect differences in acoustic impedances.

What is claimed is:

1. An acoustic imaging system, comprising:

a) a two-dimensional array of piezoelectric transducers for receiving and converting acoustic energy into electrical signal representative of an image, the transducers being arranged in multiple rows each extending along a row direction, and in multiple columns each extending along a column direction transverse to the row direction, the array including multiple two-dimensional sub-arrays of the transducers, each sub-array having a plurality of the transducers spaced apart along the rows and the columns, the transducers having outer and inner ends spaced apart along a predetermined direction perpendicular to the row and column directions, the inner ends of the transducers of each sub-array being electrically interconnected, the array including a matrix polymer material among the transducers for supporting the transducers in a common plane perpendicular to said predetermined direction;

b) an interconnect layer laying in an interconnect plane perpendicular to said predetermined direction and including an electrically insulating material and a plurality of electrically conducting tracks extending through the insulating material, the interconnect layer having opposite major surfaces, a plurality of contact pads spaced apart along the row and column directions and along a predetermined spacing at one of said major surfaces, and a plurality of power conductors and a plurality of data conductors at the other of said major surfaces;

c) an acoustic matching layer acoustically coupled to, and extending over, the outer ends of the transducers, the matching layer lying in a common plane perpendicular to said predetermined direction;

d) an acoustic backing layer acoustically coupled to, and extending over, the inner ends of the transducers between the array and the interconnect layer, the backing layer including an acoustic energy-absorbing material and a plurality of electrically conductive paths extending through the energy-absorbing material for conducting the electrical signals from the transducers to the contact pads on the interconnect layer, the interconnect layer extending across all the conductive paths along the interconnect plane;

e) a plurality of read-out electronic chips on the other of said major surfaces of the interconnect layer and electrically connected to the power conductors, each chip having a plurality of contacts spaced apart along a chip spacing smaller than said predetermined spacing and being electrically connected to a respective sub-array through a plurality of the tracks and a plurality of the paths, the plurality of the tracks extending and fanning down from the respective pads to the respective contacts for processing the electrical signals from the respective sub-array to obtain a constituent data signal, at least one of the tracks extending at least partly along said predetermined direction and at least partly along a direction perpendicular to said predetermined direction; and f) a multiplexer electrically connected to the chips through the data conductors for multiplexing the data signal from each chip to obtain a composite data output signal representative of the image.

2. The acoustic transducing system of claim 1, wherein the energy-absorbing material of the backing layer is a resin material, and wherein the conductive paths are metal conductors extending through the resin material along said predetermined direction.

3. The acoustic transducing system of claim 1, wherein the row and column directions are mutually orthogonal.

4. The acoustic transducing system of claim 1, wherein the interconnect layer has a first surface for supporting the backing layer, and a second surface opposite the first surface, and wherein the chips are electrically connected on the second surface.

5. The acoustic transducing system of claim 1, wherein each sub-array has ten rows and ten columns and includes one hundred of the transducers.

6. The acoustic imaging system of claim 1, wherein the transducers are operative for receiving acoustic energy in a range from 0.1 to 20 MHZ.

7. The acoustic transducing system of claim 1, wherein a first group of the transducers is operative for receiving acoustic energy at a first sub-range of acoustic frequencies, and a second group of the transducers is operative for receiving acoustic energy at a second sub-range of acoustic frequencies.

8. The acoustic transducing system of claim 1, wherein the composite signal has image data.

* * * * *